(12) United States Patent
Kim

(10) Patent No.: US 8,093,079 B2
(45) Date of Patent: Jan. 10, 2012

(54) METHODS OF FABRICATING A LIGHT-EMITTING DEVICE

(75) Inventor: Yu-Sik Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/662,056

(22) Filed: Mar. 30, 2010

(65) Prior Publication Data

US 2010/0248400 A1     Sep. 30, 2010

(30) Foreign Application Priority Data

Mar. 30, 2009   (KR) .................... 10-2009-0027088

(51) Int. Cl.
*H01L 21/00* (2006.01)
(52) U.S. Cl. ........... 438/29; 257/E21.499; 257/E21.529; 257/E21.53; 257/E21.599; 438/7; 438/16; 438/22; 438/33
(58) Field of Classification Search ........... 257/E21.499, 257/E21.529, E21.53, E21.599; 438/7, 16, 438/22, 29, 33
See application file for complete search history.

(56) References Cited

U.S. PATENT DOCUMENTS

| 7,344,952 | B2 | 3/2008 | Chandra | |
|---|---|---|---|---|
| 2009/0286335 | A1* | 11/2009 | Le Toquin | 438/15 |
| 2010/0155750 | A1* | 6/2010 | Donofrio | 257/91 |
| 2011/0070669 | A1* | 3/2011 | Hiller et al. | 438/16 |

FOREIGN PATENT DOCUMENTS

| JP | 11-046019 | 2/1999 |
|---|---|---|
| KR | 10-2008-0001286 | 1/2008 |

\* cited by examiner

*Primary Examiner* — Asok Sarkar
(74) *Attorney, Agent, or Firm* — Harness, Dickey & Pierce, P.L.C.

(57) ABSTRACT

Methods of fabricating of a light-emitting device are provided, the methods include forming a plurality of light-emitting units on a substrate, measuring light characteristics of the plurality of light-emitting units, respectively, depositing a phosphor layer on the plurality of light-emitting units using a printing method, and cutting the substrate to separate the plurality of light-emitting units into unit by unit. The phosphor layer is adjustably deposited according to the measured light characteristics of the plurality of light-emitting units.

10 Claims, 12 Drawing Sheets

US 8,093,079 B2

METHODS OF FABRICATING A LIGHT-EMITTING DEVICE

CROSS-REFERENCE TO RELATED APPLICATION

This application claims the benefit of priority under 35 U.S.C. §119 from Korean Patent Application No. 10-2009-0027088 filed on Mar. 30, 2009 in the Korean Intellectual Property Office, the contents of which in its entirety are herein incorporated by reference.

BACKGROUND

1. Technical Field

Example embodiments of the inventive concepts relate to methods of fabricating a light-emitting device.

2. Description of the Related Art

Light-emitting devices (e.g., light-emitting diodes (LEDs)) emit light when electrons and holes are combined. The light-emitting devices have low power consumption, extended life span, are installable without spatial limitation and/or are robustness against vibration.

A light-emitting package can generate light of various wavelengths (e.g., blue light, UV light, white light or the like). For example, a white light-emitting package capable of generating white light is fabricated in the following manner. The white light-emitting package capable of generating a bluish light may be fabricated by depositing a yellow phosphor on a blue light element that generates blue light. Alternatively, the white light-emitting package capable of generating a bluish light may be fabricated by depositing a yellow phosphor and a red phosphor on a blue light element that generates blue light.

The white light-emitting package fabricated in such a manner may have a considerably wide range of color temperatures. However, white light-emitting packages that do not fall under a predefined (or set) range of color temperatures are considered "fails" that are to be disposed of.

SUMMARY

Example embodiments of the inventive concepts relate to methods of fabricating a light-emitting device. Example embodiments of the inventive concepts provide a light-emitting package which controls a color temperature.

The above and other objects will be described in or be apparent from the following description of the example embodiments.

According to example embodiments of the inventive concepts, there is provided a light-emitting device including forming a plurality of light-emitting units on a substrate, measuring light characteristics of the plurality of light-emitting units, respectively, depositing a phosphor layer on the plurality of light-emitting units using a printing method, and cutting the substrate to separate the plurality of light-emitting units unit by unit. Deposition of the phosphor layer is adjustably performed according to the measured light characteristics of the plurality of light-emitting units.

Here, the light-emitting units may be fabricated in various forms including in light-emitting units, or in light-emitting chips.

The printing method may be performed using a micro inkjet method. The light characteristics of the plurality light-emitting units may be measured in the form of power, or a wavelength. In detail, the phosphor layer is deposited with a thickness smaller than a reference thickness when one of the plurality of light-emitting units has a power level that is less than a reference power level range. The phosphor layer is deposited with a thickness greater than a reference thickness when one of the plurality of light-emitting units has a power level that is greater than a reference power level range. Another of the plurality of light-emitting units may have a power that deviates from a reference power range and the phosphor layer is not deposited on the another of the light-emitting units. The plurality of light-emitting units may include a first light-emitting unit and a second light-emitting unit. If the first light-emitting unit has power that is less than a reference power range, the phosphor layer, which is formed on the first light-emitting unit, is deposited to a thickness smaller than a reference thickness. If the second light-emitting unit has power that is greater than the reference power range, the phosphor layer, which is formed on the second light-emitting unit, is deposited to a thickness greater than the reference thickness. In addition, the plurality of light-emitting units further include a third light-emitting unit, the third light-emitting unit has power that deviates from the reference power range. The phosphor layer is not deposited on the third light-emitting unit.

BRIEF DESCRIPTION OF THE DRAWINGS

The above and other features and advantages will become more apparent by describing in detail example embodiments thereof with reference to the attached drawings in which:

FIGS. 1 through 4A are cross-sectional views illustrating intermediate process steps for explaining a fabricating method of a light-emitting device according to example embodiments of the inventive concepts;

DETAILED DESCRIPTION OF EXAMPLE EMBODIMENTS

Figure 1:
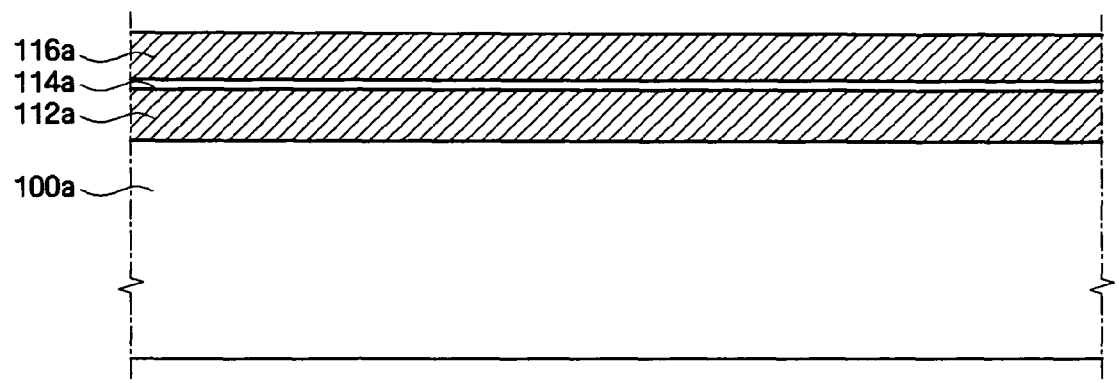

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described. Example embodiments of the inventive concepts relate to methods of fabricating a light-emitting device.

Hereinafter, example embodiments of the inventive concepts will be described in detail with reference to the accompanying drawings.

FIGS. 1 through 4A are cross-sectional views illustrating intermediate process steps for explaining a fabricating method of a light-emitting device according to example embodiments of the inventive concepts.

While FIGS. 1 through 4A illustrate the light-emitting device (e.g., a light-emitting package) fabricated using a flip-chip type LED by way of example, example embodiments of the inventive concepts are not limited thereto.

Referring to FIG. 1, a first conductive layer 112a, a light-emitting layer 114a and a second conductive layer 116a are sequentially formed on one surface of a substrate 100a.

The first conductive layer 112a, the light-emitting layer 114a and the second conductive layer 116a may be formed of $In_xAl_yGa_{(1-x-y)}N$ ($0 \leq x \leq 1$, $0 \leq y \leq 1$). The first conductive layer 112a, the light-emitting layer 114a and the second conductive layer 116a may be formed of, for example, AlGaN or InGaN.

The first conductive layer 112a may have a first conductivity type (e.g., a p-type), and the second conductive layer 116a may be of a second conductivity type (e.g., an n-type), or vice versa according to the design scheme.

The light-emitting layer 114a is a region where carriers (i.e., holes) of the first conductive layer 112a are recombined with carriers (i.e., electrons) of the second conductive layer 116a in the light-emitting layer 114a to generate light.

Although not illustrated, the light-emitting layer 114a may include a well layer and a barrier layer. Because a well layer has a smaller band gap than the barrier layer, carriers (i.e., electrons and holes) gather in the well layer, and then are recombined in the light-emitting layer 114a. The light-emitting layer 114a may be classified as a single quantum well (SQW) structure or a multiple quantum well (MQW) structure according to the number of well layers. In detail, the light-emitting layer 114a having an SQW structure has a single well layer, and the light-emitting layer 114a having an MQW structure has multiple well layers. In order to adjust emission characteristics, at least one selected from boron (B), phosphorus (P), silicon (Si), magnesium (Mg), zinc (Zn), selenium Se and combinations thereof may be doped into at least one of the well layer and the barrier layer.

The first conductive layer 112a, the light-emitting layer 114a and the second conductive layer 116a may be sequentially formed by metal organic chemical vapor deposition (MOCVD), liquid phase epitaxy, hydride vapor phase epitaxy, molecular beam epitaxy, or metal organic vapor phase epitaxy (MOVPE).

After forming the second conductive layer 116a, annealing may be performed to activate the second conductive layer 116a. The annealing may be at a temperature of approximately 400° C., for example. In detail, when the second conductive layer 116a is, for example, an Mg-doped $In_xAl_yGa_{(1-x-y)}N$ layer, the annealing may separate hydrogen (H) bonded to Mg, thereby ensuring the second conductive layer 116a exhibits p-type characteristics.

The substrate 100a may be made of any material so long as it permits growth of the first conductive layer 112a, the light-emitting layer 114a and the second conductive layer 116a. Examples of the substrate 100a may include an insulating substrate (e.g., sapphire ($Al_2O_3$) or zinc oxide (ZnO)), a conductive substrate (e.g., silicon (Si) or silicon carbide (SiC)), and so on.

Figure 2:
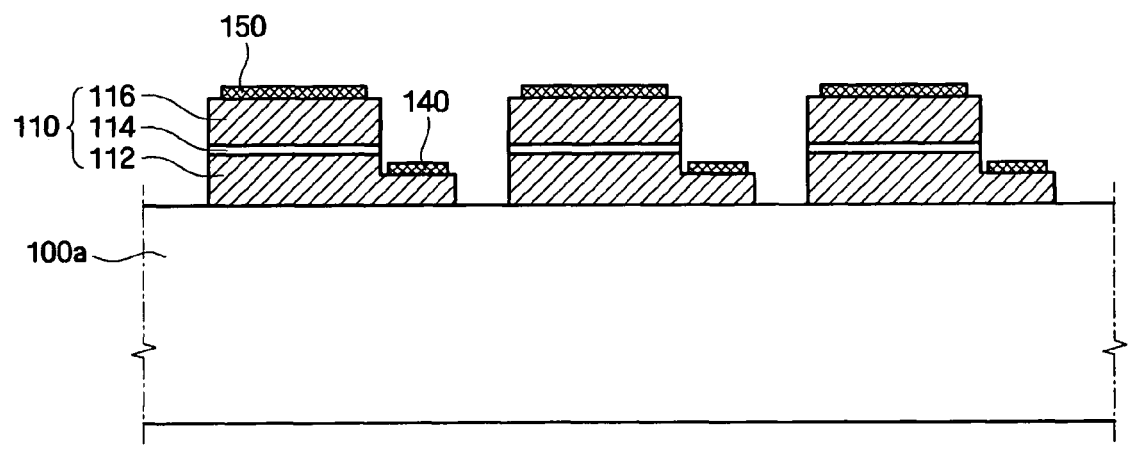

Referring to FIG. 2, the second conductive layer 116a, the light-emitting layer 114a, and the first conductive layer 112a are etched to form a plurality of light-emitting units 110 on a surface of the substrate 100a. Each of the plurality of light-emitting units 110 includes a first conductive pattern 112, a light-emitting pattern 114 and a second conductive pattern 116.

A first chip electrode 140 is formed electrically connected to the first conductive pattern 112, and a second chip electrode 150 is formed electrically connected to the second conductive pattern 115.

The first chip electrode 140 may include, for example, at least one selected from the group consisting of silver (Ag), aluminum (Al), indium tin oxide (ITO), copper (Cu), nickel (Ni), chromium (Cr), gold (Au), titanium (Ti), platinum (Pt), vanadium (V), tungsten (W), molybdenum (Mo) and combinations thereof.

The second chip electrode 150 may be made of a material having a substantially high reflectivity. For example, the second chip electrode 150 may include at least one of silver (Ag), aluminum (Al) and combinations thereof. Because the light-emitting unit 110 (i.e., the light-emitting pattern 114) is reflected at the second chip electrode 150 and may then escape (or travel) outside of the unit, the second chip electrode 150 may be made of a highly reflective material.

Light characteristics of the respective light-emitting units 110 are measured. In a state in which the plurality of light-emitting units 110 are formed on the single substrate 100a, the light characteristics of the plurality light-emitting units 110 are measured, respectively. For example, the light characteristics of the plurality light-emitting units 110 may be in the form of power or wavelength.

Figure 3:
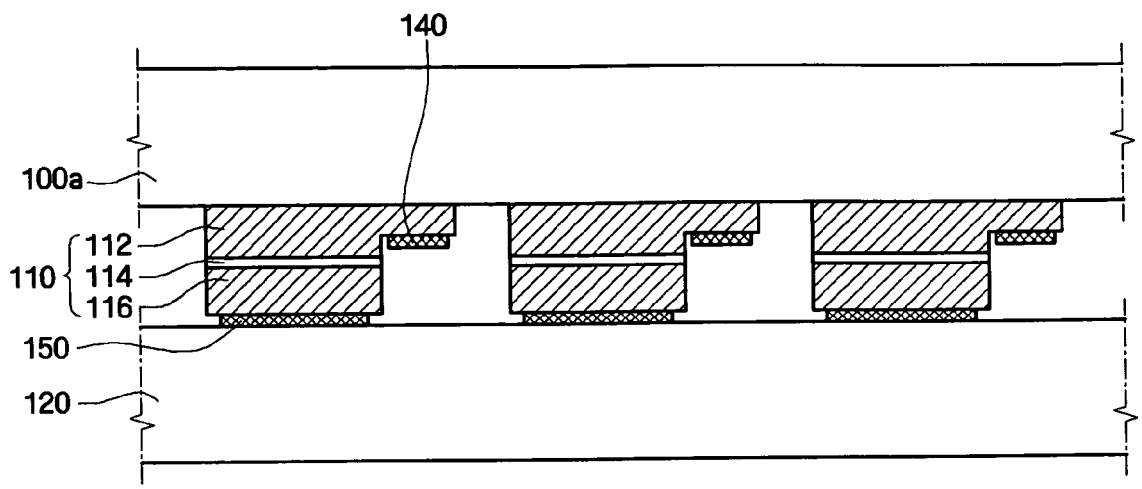

Referring to FIG. 3, the substrate 100a having the plurality of light-emitting units 110 formed thereon is placed on a plate 120 such that one surface of the substrate 100a faces the plate 120. For example, the plate 120 and the substrate 100a may be bonded to each other using wax.

A thickness of the substrate 100a is reduced by grinding the other (or opposing) surface of the substrate 100a.

Although not illustrated, the light characteristics of the plurality light-emitting units 110 may be measured after reducing the thickness of the substrate 100a.

Figure 4A:
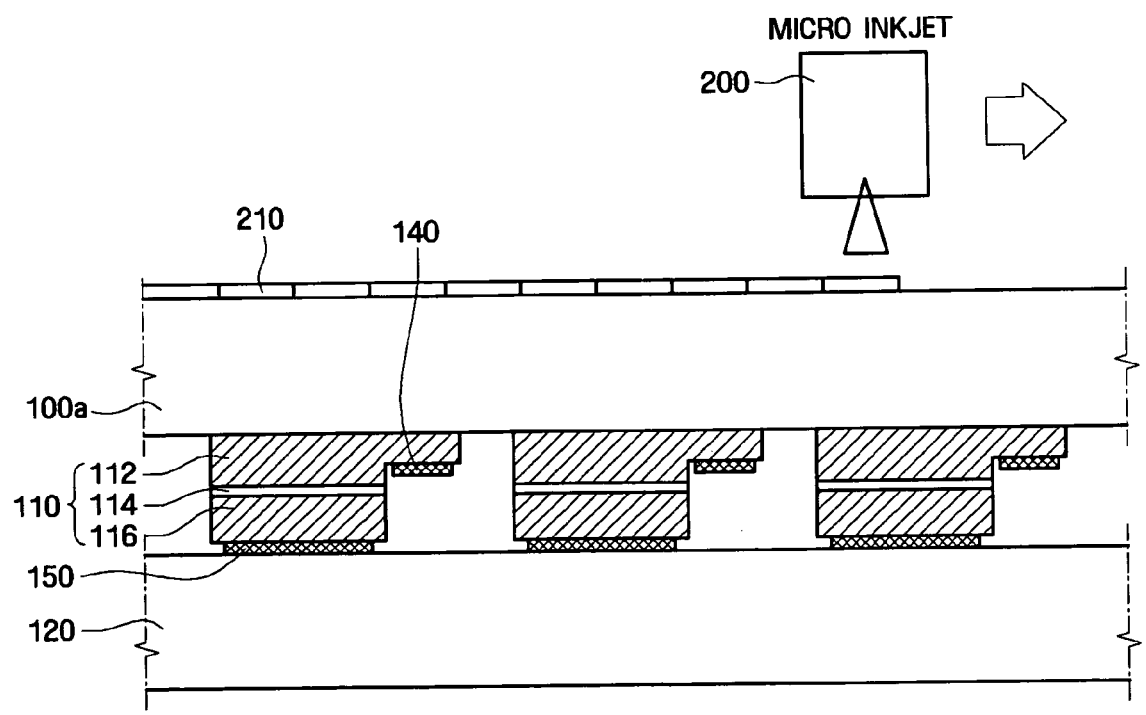

Referring to FIG. 4A, a phosphor layer 210 is deposited on the plurality light-emitting units 110 by printing. The phosphor layer 210 absorbs light emitted from the light-emitting unit 110 and converts it into a light having a different wavelength. The phosphor layer 210 includes a substance that absorbs the light primarily emitted from the light-emitting unit 110 and then secondarily emits the absorbed light.

Use of the phosphor layer 210 allows a light-emitting device to represent various colors. For white color rendering, the following method may be used. If the light-emitting unit 110 emits light with a blue wavelength (in this case, the light-emitting unit 110 is to be referred to as a blue light-emitting device), the phosphor layer 210 may include a yellow phosphor that converts the wavelength of some of the blue light to generate a yellow light, and a red phosphor that converts the wavelength of some of the blue light to generate a red light. Alternatively, the phosphor layer 210 may also include a green phosphor that converts the wavelength of some of the blue light to generate a green light, and a red phosphor that converts the wavelength of some of the blue light to generate a red light. In other words, white light is produced by mixing the light generated based on the primary emission by the light-emitting unit 110 and the light based on the secondary emission by the phosphor layer 210.

If the light-emitting unit 110 emits light with an ultraviolet (UV) wavelength, the phosphor layer 210 may include red, green and blue (RGB) phosphors.

For example, the phosphor layer 210 may be at least one selected from the group consisting of a nitride-based/oxynitride-based phosphor primarily activated by lanthanoids (e.g., Eu and Ce), an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor and a germinate phosphor, primarily activated by lanthanoids (e.g., Eu) or transition metals (e.g., Mn), a rare earth aluminate phosphor primarily activated by lanthanoids (e.g., Ce), a rare earth silicate phosphor, an organic material or organic complex primarily activated by lanthanoids (e.g., Ce).

In the fabricating method of the light-emitting device according to example embodiments of the inventive concepts, the phosphor layer 210 is adjustably deposited on each of the plurality of light-emitting units 110 according to the measured light characteristics of the light-emitting units 110.

For example, for measured power to deviate a reference power range is fixable. That is, if the measured power of a first light-emitting unit 110 falls short of the reference power range, the phosphor layer 210 deposited on the first light-emitting unit 110 has a thickness smaller than a reference thickness. If the measured power of a second light-emitting unit 110 is beyond the reference power range, the phosphor layer 210 deposited on the first light-emitting unit 110 has a thickness greater than the reference thickness.

For example, assuming that the first light-emitting unit 110 is a blue LED and the phosphor layer 210 includes a yellow phosphor and a red phosphor, if a power level of the first light-emitting unit 110 is too low, the intensity of blue light is extremely weak. Intensity levels of yellow light produced from the yellow phosphor and red light produced from the red phosphor are relatively larger than an intensity level of blue light. Thus, white light is not properly represented even by mixing yellow light, red light and blue light. In this case, in order to reduce the intensity levels of yellow light and red light, a thickness of a phosphor may be reduced. On the contrary, if the power level of the first light-emitting unit 110 is too high, the intensity of blue light is also too high. In order to represent white light properly, the power levels of yellow light and red light may be increased by increasing the thickness of a phosphor. In such a manner, the color temperature can be controlled in the manufacture of a light-emitting device.

As described above, white light can be produced such that bluish white light is produced by depositing a yellow phosphor on a blue LED producing blue light or reddish white light is produced by depositing a yellow phosphor and a red phosphor on a blue LED. The reddish white light may contain white light having various bins. In such a case, binning of the reddish white light may be controlled by varying the proportion of the yellow phosphor deposited to that of the red phosphor.

For a measured wavelength to deviate a reference wavelength range is not fixable. Thus, if a measured wavelength of a third light-emitting unit 110 deviates from a reference wavelength range, the phosphor layer 210 is not deposited on the third light-emitting unit 110. The third light-emitting unit 110 having the measured wavelength of the third light-emitting unit 110 beyond a reference wavelength range is considered a "failed" product that cannot be used. As such, it is not necessary to deposit the phosphor layer 210 thereon, thereby saving the cost.

Deposition of the phosphor layer 210 may be performed by printing, more specifically, using micro inkjet 200. The micro inkjet 200 is used because various phosphors can be controlled individually by using the micro inkjet 200. Also, various bins can be easily produced by adjusting proportions of various phosphors.

Subsequently, the substrate 100a is cut to separate the plurality of light-emitting units 110 formed on the substrate 100, the plurality of light-emitting units 110 each having the phosphor layer 210 deposited thereon, into discrete light-emitting chips, thereby completing a light-emitting package.

Figure 4B:
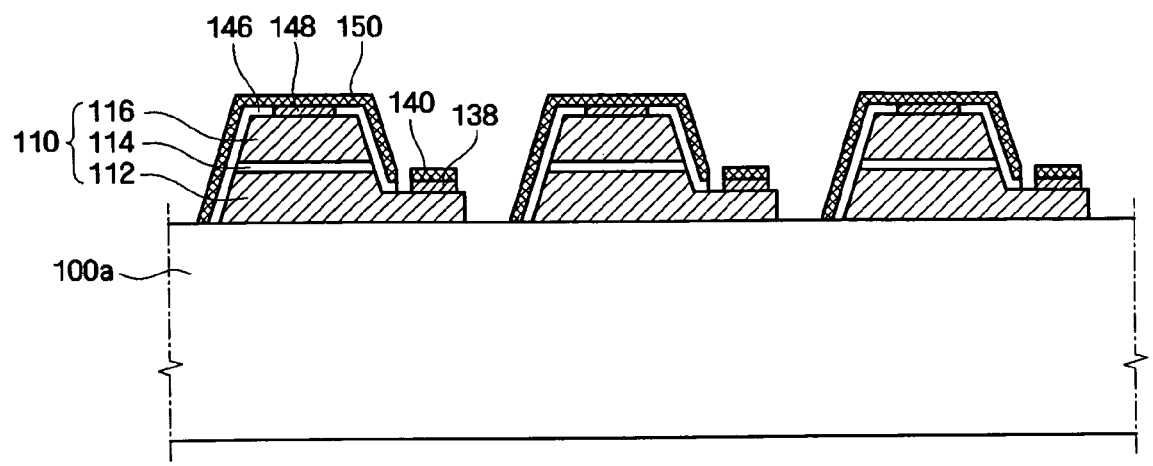
FIGS. 4B and 4C are cross-sectional views illustrating intermediate process steps for explaining a fabricating method of a light-emitting device according to example embodiments of the inventive concepts.
Figure 4C:
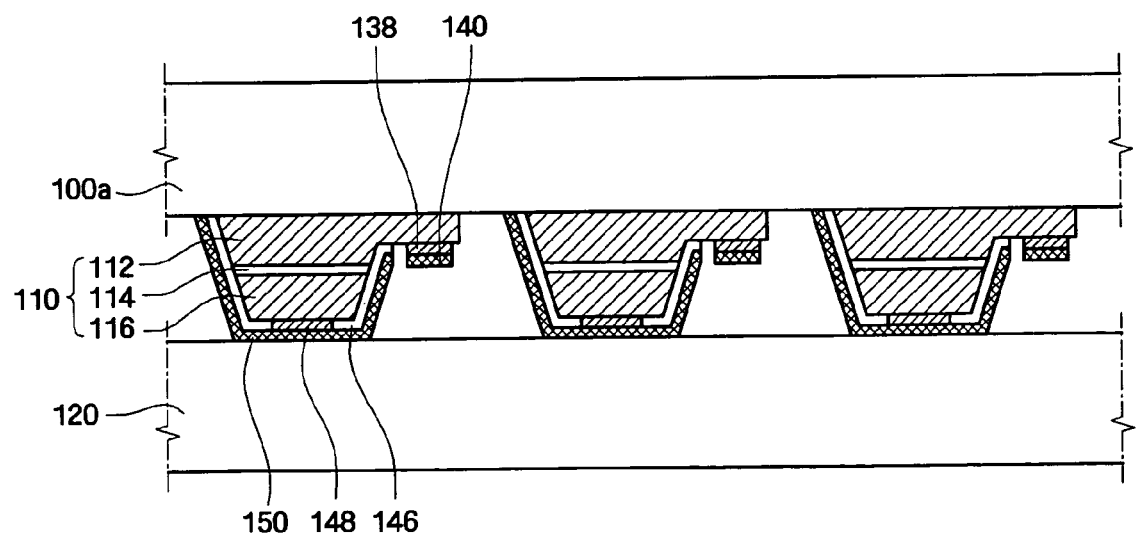

FIGS. 4B and 4C are cross-sectional views illustrating intermediate process steps for explaining a fabricating method of a light-emitting device according to example embodiments of the inventive concepts.

In detail, instead of the light-emitting unit 110 illustrated in FIG. 2, the light-emitting unit 110 illustrated in FIG. 4B is formed.

Referring to FIG. 4B, the light-emitting units 110 having slanting sidewalls are formed, and a second chip electrode 150 may be formed on a top surface and sidewalls. An insulating layer 146 is formed between the light-emitting unit 110 and the second chip electrode 150. The second conductive layer 116a (not shown) and the second chip electrode 150 may be electrically connected to each other through a second ohmic layer 148. A width of the first conductive pattern 112 may be greater than that of the second conductive pattern 116. A first ohmic layer 138 and a first chip electrode 140 may be sequentially formed on the first conductive pattern 112.

Light characteristics of the plurality of light-emitting units 110 may be measured. The light generated from each of the plurality of light-emitting units 110 is directed only towards the substrate 100a. The light characteristics of the plurality of light-emitting units 110 may be measured with relatively high accuracy.

Referring to FIG. 4C, the substrate 100a having the plurality of light-emitting units 110 formed thereon is positioned on a plate 120 so that one surface of the substrate 100a is opposite to and facing the plate 120.

In a similar manner as illustrated in FIG. 4A, a phosphor layer 210 is deposited on the plurality of light-emitting units 110 by printing.

As described above, because the second chip electrode 150 is formed on the top surface and on the sidewalls of each light-emitting unit 110, the light generated from each of the plurality of light-emitting units 110 is directed only towards the substrate 100a. The phosphor contained in the phosphor layer deposited on the substrate 100a is exposed to almost 100% of the light, thereby achieving more uniform color distribution of white light.

Figure 6:
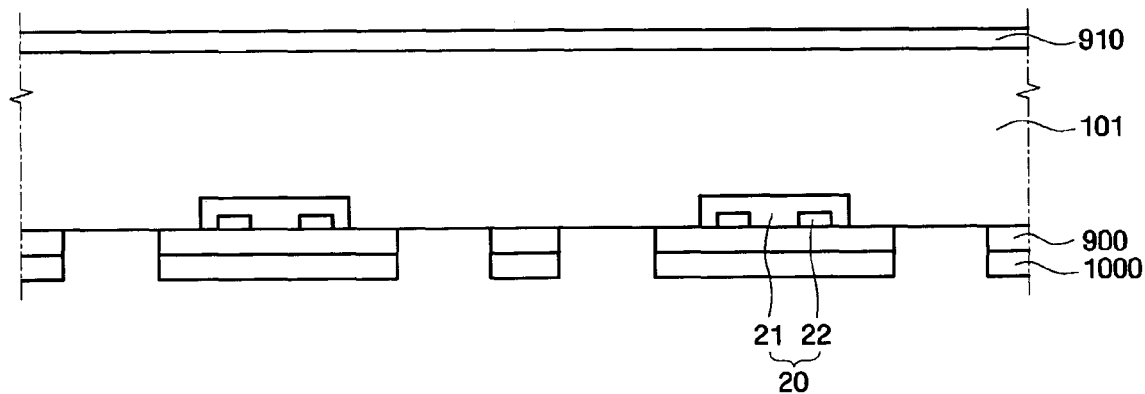
Figure 7:
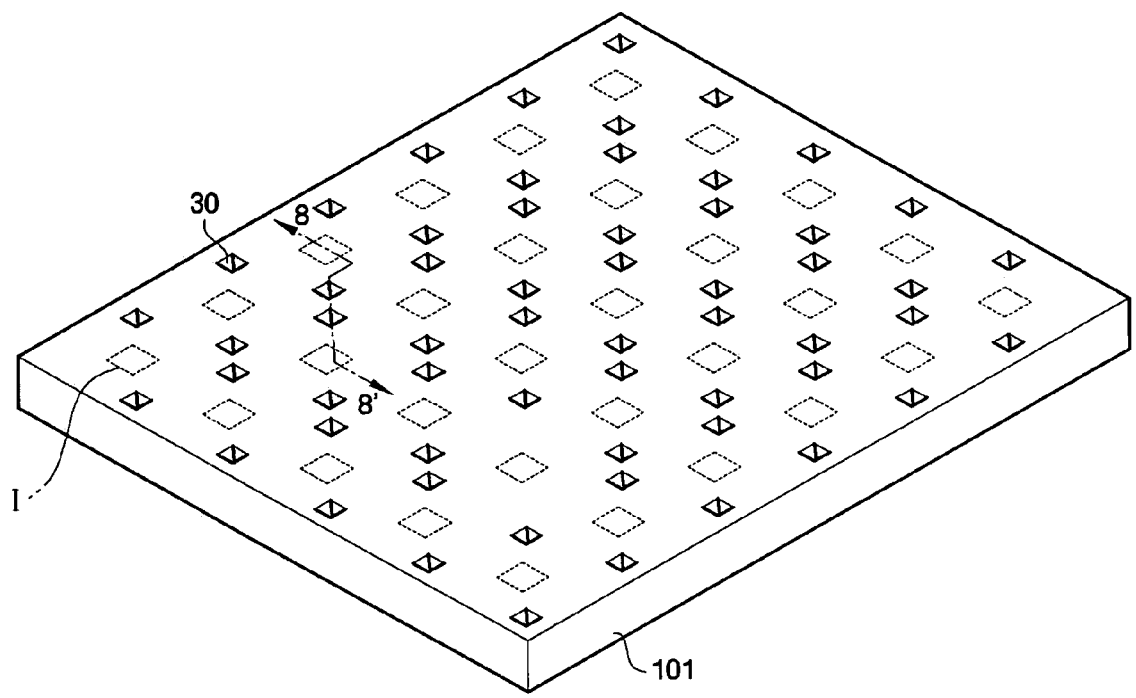
Figure 8:
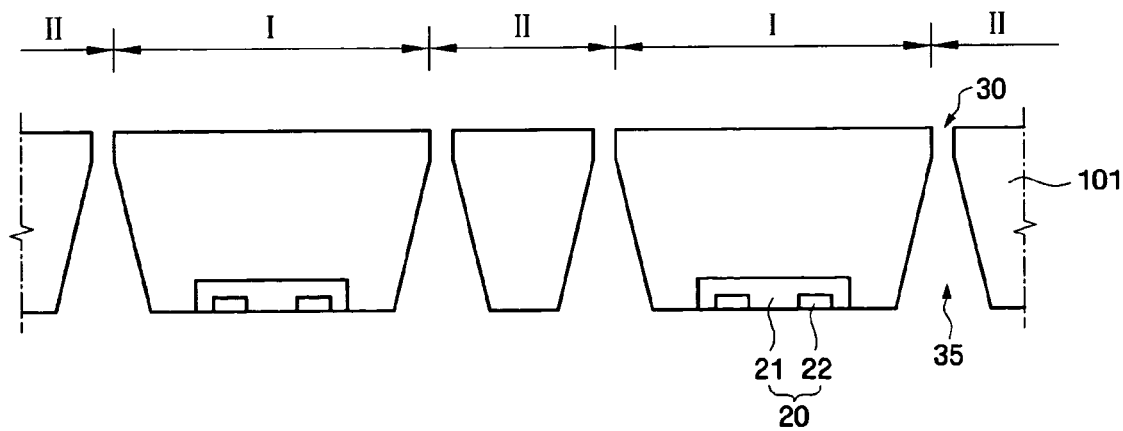

FIGS. 5 through 12 are cross-sectional views illustrating intermediate process steps for explaining a fabricating method of a light-emitting device according to example embodiments of the inventive concepts. FIG. 8 is a cross-sectional view taken along the line 8-8' of FIG. 7.

Figure 5:
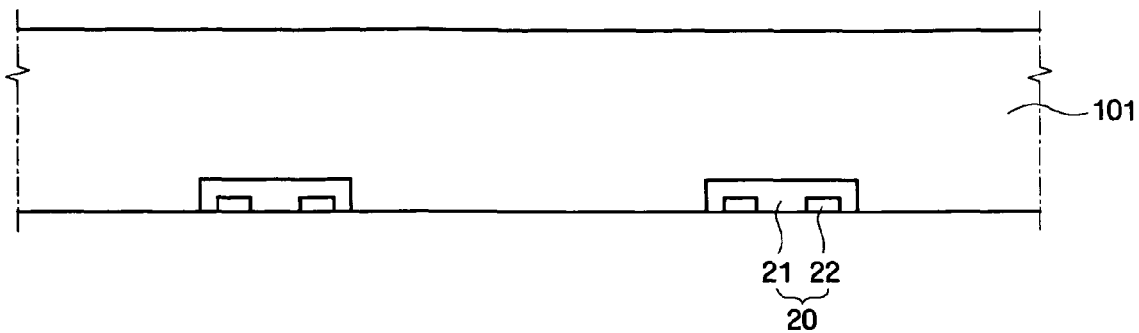
FIGS. 5 through 12 are cross-sectional views illustrating intermediate process steps for explaining a fabricating method of a light-emitting device according to example embodiments of the inventive concepts.

Referring to FIG. 5, a zener diode 20 is formed in the substrate 101. In detail, the substrate 101 may include, for example, silicon (Si), strained Si, Si alloy, silicon-on-insulator (SOI), silicon carbide (SiC), silicon germanium (SiGe), silicon germanium carbide (SiGeC), germanium (Ge), Ge alloy, gallium arsenide (GaAs), indium arsenide (InAs), aluminum nitride (AlN), ceramic (Cs), one of polyimides, composites of these materials and stacks thereof. However, example embodiments are not limited thereto. In addition, the substrate 101 may be an undoped substrate, but example embodiments of the inventive concepts are not limited thereto.

When an over-voltage is applied to the light-emitting element 90 due to static electricity, the zener diode 20 may form a by-pass current to prevent the light-emitting element 90 from being damaged.

The zener diode 20 may be provided in the substrate 101, specifically on the other surface of the substrate 101.

In addition, the zener diode 20 may include a first impurity region 21 of a second conductivity type (e.g., a p-type), and a second impurity region 22 of a first conductivity type (e.g., an n-type) different from the second conductivity type. The second impurity region 22 is in contact with the first impurity region 21, and may include at least two regions. As illustrated, when the second impurity region 22 includes two regions, the two-part second impurity region 22 may be electrically connected to and may overlap with the first electrode 51 and the second electrode 52, respectively.

Like in the illustrated example embodiments of the inventive concepts, in a case where the zener diode 20 is formed by forming the first impurity region 21 and the second impurity region 22 in the undoped substrate 101, doping concentrations of the first impurity region 21 and the second impurity region 22 may be easily adjusted. In such a case, the first impurity region 21 may be formed in a relatively low concentration, while the second impurity region 22 may be formed in a relatively high concentration. For example, the doping concentration of the first impurity region 21 may be not less than $5\times10^{16}$ cm$^3$ and not greater than $1\times10^{18}$ cm$^3$, and the doping concentration of the second impurity region 22 may be higher than that of the first impurity region 21.

Referring to FIG. 6, a mask layer 910 and a mask pattern 900 are formed on first and second surfaces of a substrate 101, respectively.

In detail, the mask layer 910 is formed on the first and second surfaces of the substrate 101, and a first photoresist pattern 1000 is formed on the second surface of the substrate 101. The substrate 101 is etched using the mask layer 910, thereby forming the mask pattern 900. Here, the first photoresist pattern 1000 and the mask pattern 900 are formed at potential areas of a mounting region (I) and an isolation area (II) (shown in FIG. 8) to expose areas where a groove 35 and a through-hole 30 are to be formed.

The mask layer 910 is formed on the second surface of the substrate 101 for the purpose of preventing the surface of the substrate 101 from being damaged by a potassium hydroxide (KOH) solution during the etching of the groove 35. The mask pattern 900 is formed between the first photoresist pattern 1000 and the first surface of the substrate 101 for the purpose of forming the same pattern as the first photoresist pattern 1000 to be used in etching of the groove 35 using the mask pattern 900 when a photoresist contained in the first photoresist pattern 1000 is dissolved in the KOH solution.

The mask pattern 900 and the mask layer 910 may be formed of, for example, a silicon nitride layer and a silicon oxide layer, respectively.

Referring to FIGS. 7 and 8, the second surface of the substrate 101 is etched using the mask pattern 900 as an etch mask, thereby forming at least one of the grooves 35 and the through-hole 30 between each of mounting regions (I) disposed adjacent to each other. The etching of the substrate 101 may be performed by, for example, wet etching. The wet etching may be performed using a wet etchant for a potassium hydroxide (KOH) solution.

As illustrated in FIG. 8, the groove 35, which is formed on the substrate 101 exposed to the wet etchant, may have a pyramidal shape in which a sectional width of the groove 35 gradually decreases in a direction from the second surface towards the first surface. As illustrated, the groove 35 may have an "inverted V-shaped" section. In the illustrated example embodiments, two grooves are formed between each of the plurality of mounting regions (I) adjacent to each other. However, example embodiments of the inventive concepts are not limited thereto.

The through-hole 30 may be formed at an end of the groove 35 by adjusting an exposure time of the substrate 101 to KOH. Because the mask layer 910 is formed on the second surface of the substrate 101, the etching may be interrupted by the mask layer 910 in the course of forming the groove 35 by the wet etchant.

After the formation of the groove 35 and the through-hole 30, the remainders of the mask pattern 910 and the mask layer 900 may be removed by, for example, a buffered oxide etchant (BOE) or hydrogen fluoride (HF).

Figure 9:
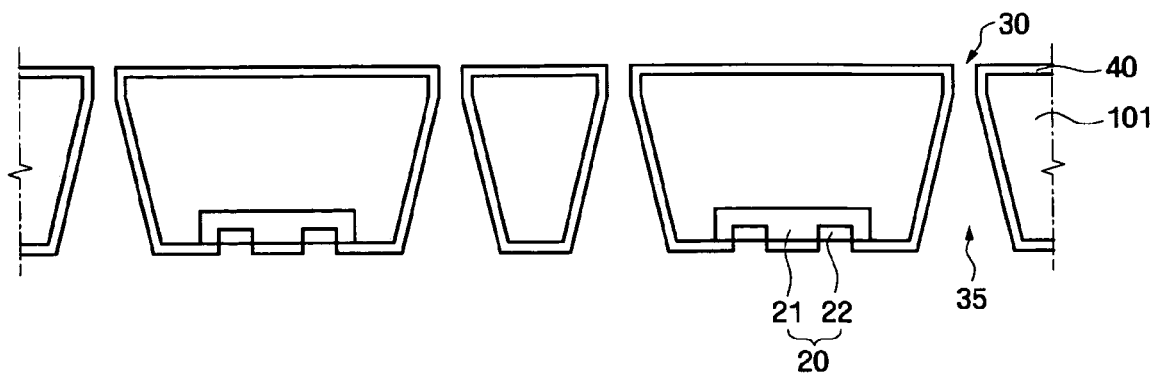

Referring to FIG. 9, a protective layer 40 made of an oxide is formed on the exposed surface of the substrate 101 by, for example, thermal oxidation.

Figure 10:
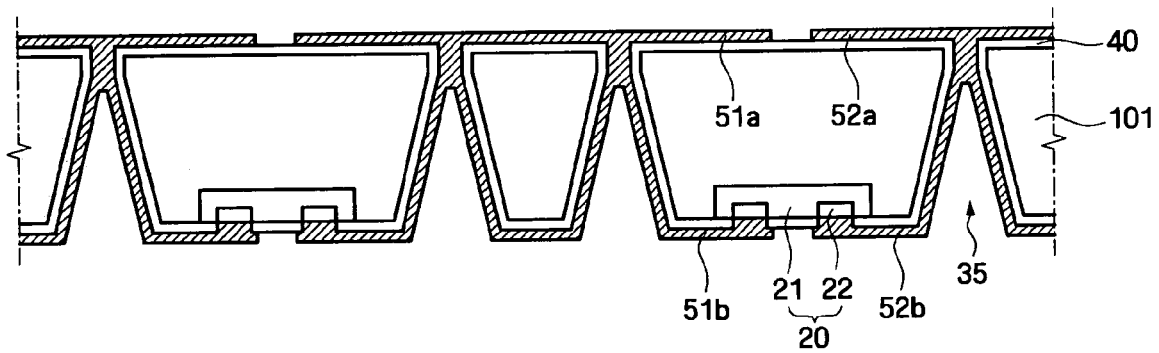

Referring to FIG. 10, first electrodes 51a and 51b and second electrodes 52a and 52b are formed on the substrate 101.

In detail, the first electrodes 51a and 51b include a first first-surface electrode 51a and a first second-surface electrode 51b. In more detail, the first first-surface electrode 51a is formed on the first surface of the substrate 101. The first second-surface electrode 51b is formed on the second surface of the substrate 101 conformally along sidewalls and bottom surface of the inverted V-shaped groove 35. The first first-surface electrode 51a and the first second-surface electrode 51b are brought into contact with each other through the through-hole 30.

The second electrodes 52a and 52b include a second first-surface electrode 52a and a second second-surface electrode 51b. In more detail, the second first-surface electrode 52a is formed on the first surface of the substrate 101. The second second-surface electrode 52b is formed on the second surface of the substrate 101 conformally along sidewalls and bottom surface of the inverted V-shaped groove 35. The second first-surface electrode 52a and the second second-surface electrode 52b are brought into contact with each other through the through-hole 30.

The first electrodes 51a and 51b and the second electrodes 52a and 52b may be formed by forming a conductive material layer on both surfaces of the substrate 101, and patterning the same. The conductive material layer may be formed by, for example, sputtering or electroplating. A single layer, or multiple layers, made of a highly conductive material demonstrating adhesiveness to the protective layer 40. For example, titanium (Ti), platinum (Pt), gold (Au), chromium (Cr), nickel (Ni), copper (Cu), silver (Ag) and combinations thereof may be used as the conductive material layer.

Figure 11:
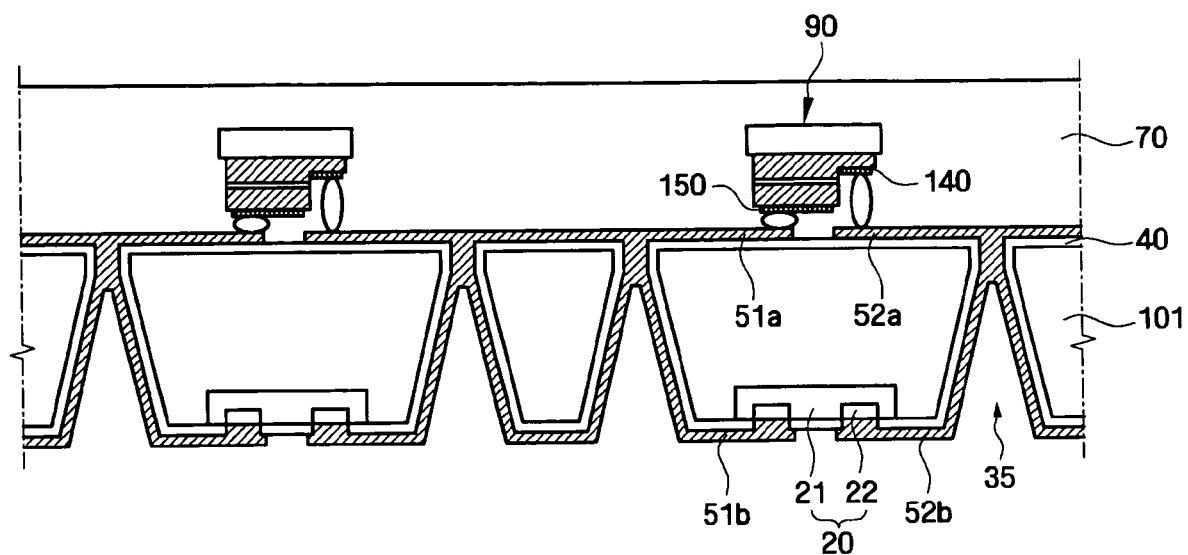

Referring to FIG. 11, a plurality of light-emitting chips 90 are placed on the first surface of the substrate 101.

In detail, each of the plurality of light-emitting chips 90 may include a light-emitting unit, a first chip electrode 140 and a second chip electrode 150 spaced apart from each other. The first chip electrode 140 and the second chip electrode 150 are electrically connected to the first electrodes 51a and 51b and the second electrodes 52a and 52b, respectively. While the illustrated light-emitting chips 90 are of a flip-chip type, example embodiments of the inventive concepts are not limited thereto.

Light characteristics of the plurality of light-emitting chips 90 are measured, respectively. In a state in which the plurality of light-emitting chips 90 are formed on the single substrate 101, the light characteristics of the plurality of light-emitting chips 90 are measured, respectively. Here, the measured light characteristics of the plurality of light-emitting chips 90 may include, for example, power, wavelength or the like.

A resin layer 70 is formed on the plurality of light-emitting chips 90. Examples of the resin layer 70 may include epoxy resin, silicon resin, hard silicon resin, modified silicon resin, urethane resin, oxetane resin, acryl resin, polycarbonate resin, polyimide resin and combinations thereof.

For example, a resin layer may be formed on the light-emitting element 100 to fill at least a portion of the groove 12 and a phosphor layer may be formed on the resin layer.

In detail, the phosphor layer may be a mixture of a transparent resin and phosphor. However, example embodiments of the inventive concepts are not limited thereto. For example, the phosphor layer may include only a phosphor without a transparent resin.

The phosphor will now be described in more detail. The phosphor absorbs light emitted from the light-emitting element 100 and converts it into a light of a different wavelength. The phosphor is a substance that absorbs the light primarily emitted from the light-emitting element 100 and then secondarily emits the absorbed light.

Figure 12:
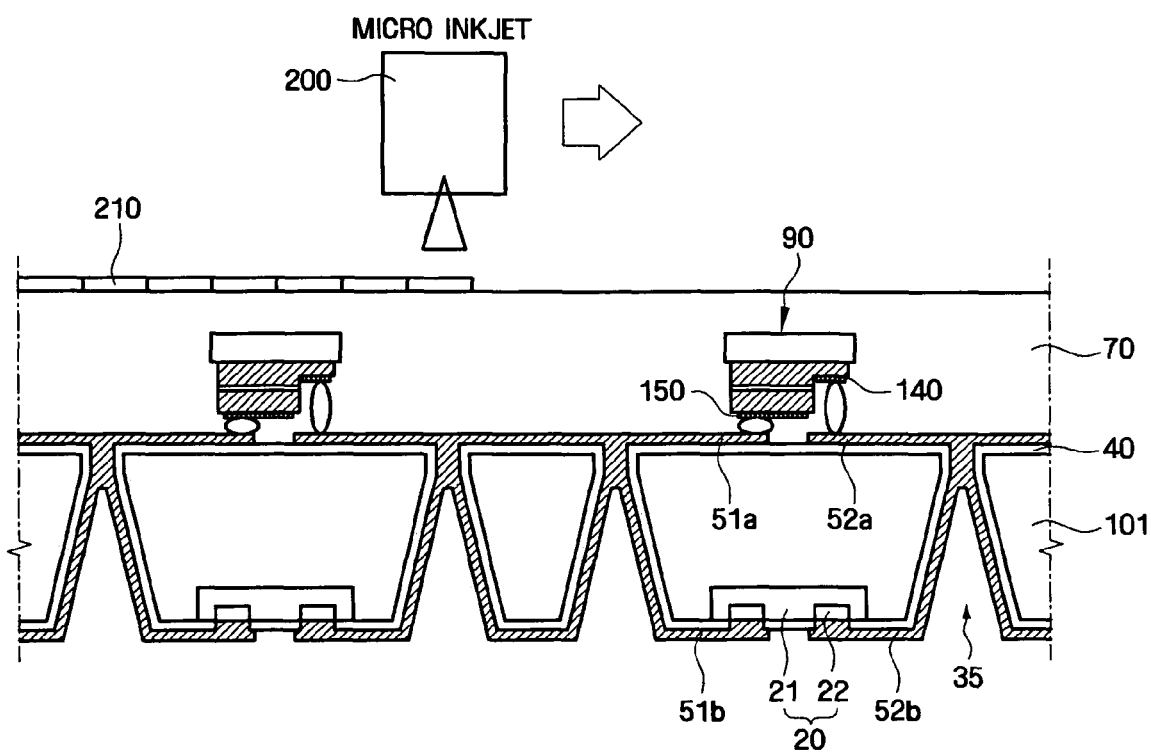

Referring to FIG. 12, a phosphor layer 210 is deposited on the plurality of light-emitting chips 90 by, for example, printing.

As described above, the phosphor layer 210 is adjustably deposited on the respective light-emitting chips 90 according to the measured light characteristics of the plurality of light-emitting chips 90.

For example, if the measured power of the first light-emitting chip 90 falls short of (or is less than) a reference power range, the phosphor layer 210 is deposited on the first light-emitting unit 90 to have a thickness smaller than a reference thickness. If the measured power of a second light-emitting unit 90 is beyond (or greater than) the reference power range, the phosphor layer 210 is deposited on the second light-emitting unit 90 to have a thickness greater than the reference thickness.

If a measured wavelength of a third light-emitting chip 90 deviates from the reference wavelength range, the phosphor layer 210 is not deposited on the third light-emitting chip 90.

Deposition of the phosphor layer 210 may be performed by printing, more specifically, using micro inkjet 200.

Subsequently, the substrate 101 is cut to separate the plurality of light-emitting chips 90 formed on the substrate 101, the plurality of light-emitting chips 90 each having the phosphor layer 210 deposited thereon, into discrete light-emitting chips, thereby completing a light-emitting package.

Figure 13:
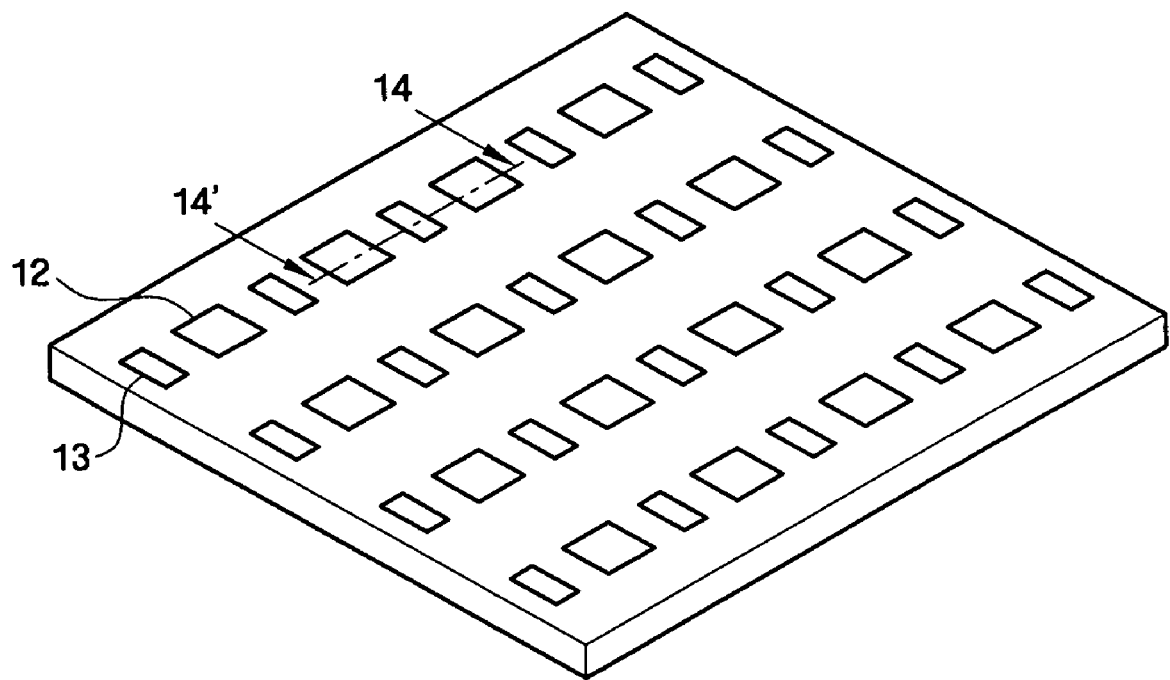
FIGS. 13 through 18 are cross-sectional views illustrating intermediate process steps for explaining a fabricating method of a light-emitting device according to example embodiments of the inventive concepts.
Figure 14:
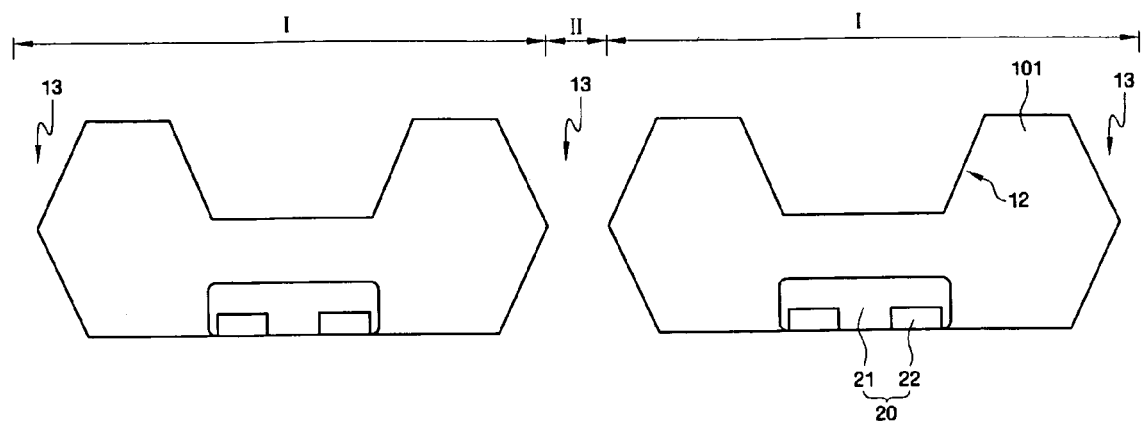

FIGS. 13 through 18 are cross-sectional views illustrating intermediate process steps for explaining a fabricating method of a light-emitting device according to example embodiments of the inventive concepts. Here, FIG. 14 is a cross-sectional view taken along the line 14-14' of FIG. 13.

While FIGS. 13 through 18 illustrate a light-emitting device fabricated using a flip chip type LED (e.g., a light-emitting package), example embodiments of the inventive concepts are not limited thereto.

A zener diode 20 is first formed in a substrate 101 as illustrated in FIG. 5.

Referring to FIGS. 13 and 14, mask patterns (not shown) are formed on first and second surfaces of the substrate 101. The substrate 101 is etched using the mask patterns.

The etching may be, for example, wet etching using KOH. A groove 12 and a through-hole 13 are formed in a mounting region (I) and an isolation area (II) of the first surface of the substrate 101, respectively.

Shapes of the groove 12 and the through-hole 13 may be determined by adjusting an exposure time of the substrate 101 to KOH. For example, the groove 12 may be formed to have slant sidewalls. The groove 12 may have a width that gradually decreases in a direction from the first surface of the substrate 101 towards the central portion thereof. The through-hole 13 may be formed such that it has a width gradually decreasing from the first or second surface of the substrate 101 towards the central portion thereof.

Like in the illustrated embodiments, the groove 12 may be singly provided in the mounting region (I). The illustrated through-hole 13 is also singly provided between two adjacent mounting regions (II). However, example embodiments of the inventive concepts are not limited thereto.

Figure 15:
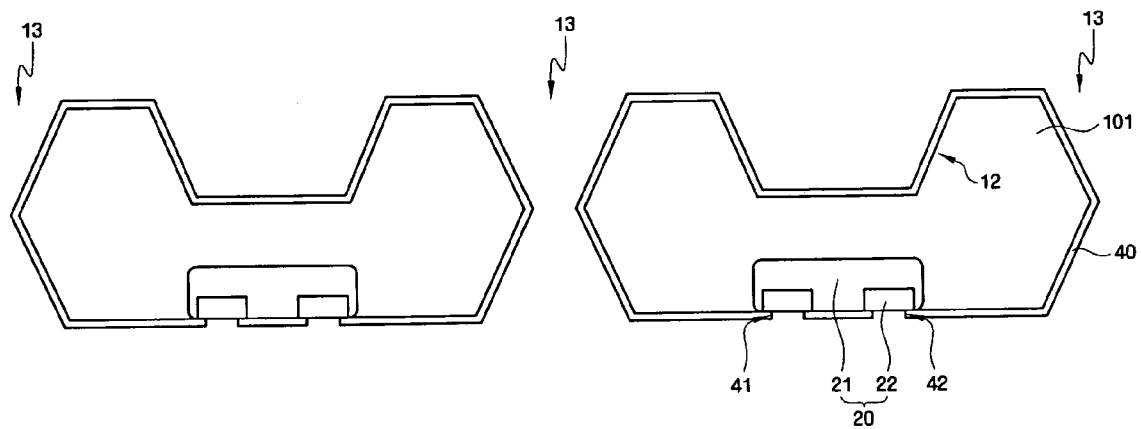

Referring to FIG. 15, a protective layer 40 may be consecutively formed along the first and second surfaces of the substrate 101, the sidewalls and bottom surface of the groove 12, and sidewalls of the through-hole 13. The protective layer 40 may be formed by, for example, thermal oxidation.

Figure 16:
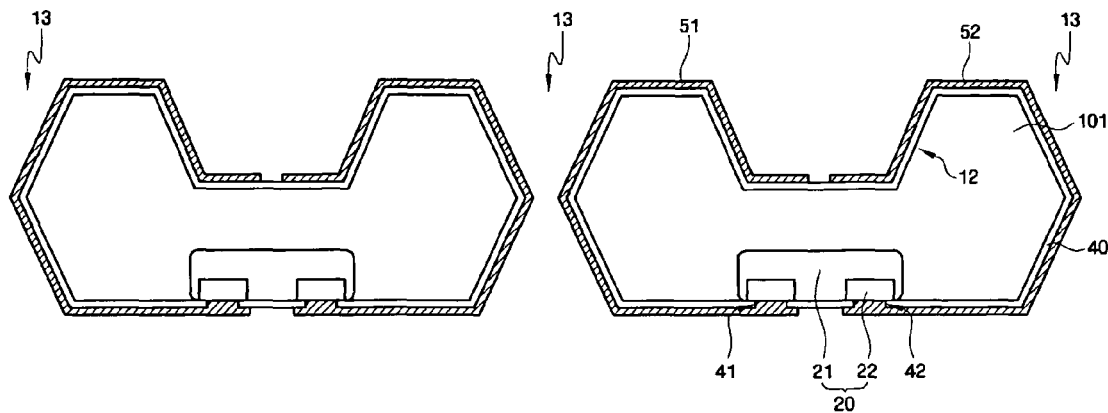

Referring to FIG. 16, the first electrode 51 and the second electrode 52 are formed on the substrate 11 spaced apart from each other. The first electrode 51 is consecutively formed along the bottom surface of the groove 12, the left sidewall of the groove 12 and the second surface of the substrate 101. The first electrode 51 is electrically connected to a second impurity region 22 through a hole 41. Similarly, the second electrode 52 is consecutively formed along the bottom surface of the groove 12, the right sidewall of the groove 12 and the first surface of the substrate 101. The second electrode 52 is electrically connected to another second impurity region 22 through a hole 42.

In detail, a conductive material is formed on the first surface of the substrate 101 by sputtering or electroplating, and then subsequently patterned. A conductive material is formed on the second surface of the substrate 101, followed by patterning. When the conductive material is formed on the second surface of the substrate 101, the conductive materials formed on the first and second surfaces are connected to each other through the through-hole 13.

Figure 17:
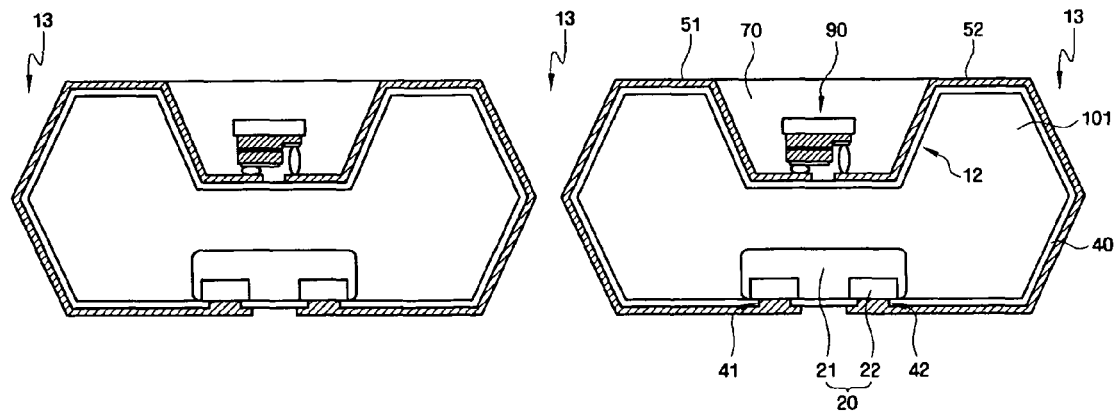

Referring to FIG. 17, a plurality of light-emitting chips 90 are placed on the first surface of the substrate 101.

In detail, each of the plurality of light-emitting chips 90 may include a light-emitting unit, a first chip electrode 140 and a second chip electrode 150 spaced apart from each other. The first chip electrode 140 and the second chip electrode 150 are electrically connected to the first electrode 51 and the second electrode 52, respectively. While the illustrated light-emitting chips 90 are of a flip-chip type, example embodiments of the inventive concepts are not limited thereto.

Light characteristics of the plurality of light-emitting chips 90 are measured, respectively. In a state in which the plurality of light-emitting chips 90 are formed on the single substrate 101, the light characteristics of the plurality of light-emitting chips 90 are measured, respectively. The measured light characteristics of the plurality of light-emitting chips 90 may include, for example, power, wavelength or the like.

A resin layer 70 is formed on the plurality of light-emitting chips 90.

Figure 18:
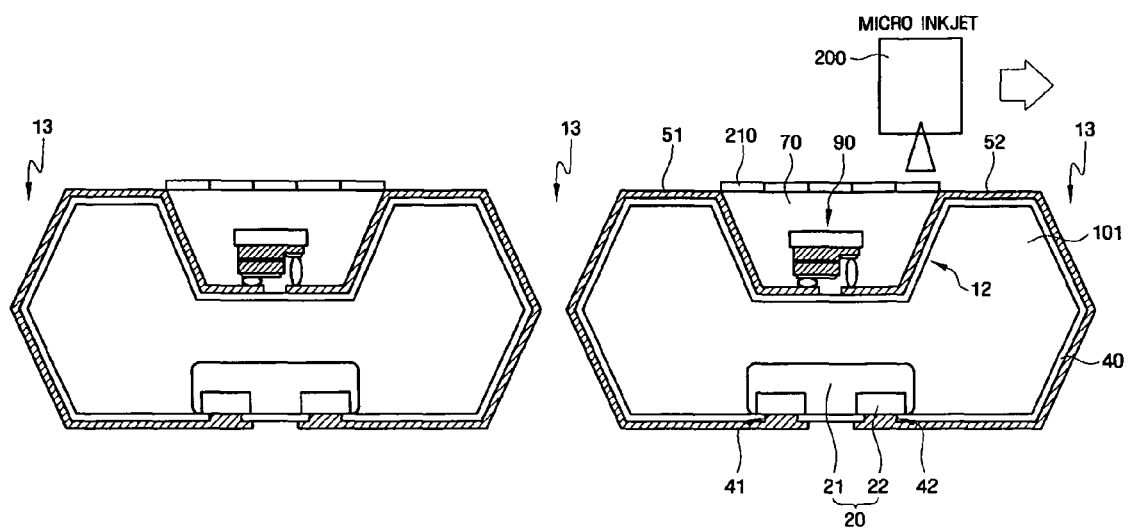

Referring to FIG. 18, a phosphor layer 210 is deposited on the plurality of light-emitting chips 90, specifically on the resin layer 70 by, for example, printing.

As described above, deposition of the phosphor layer 210 is adjustably performed according to the measured light characteristics of the plurality of light-emitting chips 90.

For example, if the measured power of a first light-emitting chip 90 falls short of (or is less than) a reference power range, the phosphor layer 210 is deposited on the first light-emitting chip 90 to have a thickness smaller than a reference thickness. If the measured power of a second light-emitting chip 90 is beyond (or greater than) the reference power range, the phosphor layer 210 is deposited on the second light-emitting unit 90 to have a thickness greater than the reference thickness.

If a measured wavelength of a third light-emitting chip 90 deviates from the reference wavelength range, the phosphor layer 210 is not deposited on the third light-emitting chip 90.

Here, deposition of the phosphor layer 210 may be performed by printing, more specifically, using micro inkjet 200.

Subsequently, the substrate 101 is cut to separate the plurality of light-emitting chips 90 formed on the substrate 101, the plurality of light-emitting chips 90 each having the phosphor layer 210 deposited thereon, into discrete light-emitting chips, thereby completing a light-emitting package.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A fabricating method of a light-emitting device, comprising:
   forming a plurality of light-emitting units on a substrate;
   measuring light characteristics of the plurality of light-emitting units, respectively;
   depositing a phosphor layer on the plurality of light-emitting units using a printing method, wherein the phosphor layer is adjustably deposited on each of the plurality of light-emitting units according to the measured light characteristics of the plurality of light-emitting units; and
   cutting the substrate to separate the plurality of light-emitting units, having the deposited phosphor layer, into unit by unit,
   wherein the phosphor layer is deposited with a thickness smaller than a reference thickness when one of the plurality of light-emitting units has a power level that is less than a reference power level range or deposited with a thickness greater than the reference thickness when the one of the plurality of light-emitting units has a power level that is greater than the reference power level range.

2. The fabricating method of claim 1, wherein the printing method includes using a micro inkjet method.

3. The fabricating method of claim 1, wherein the light characteristics of the plurality light-emitting units are measured in the form of power or wavelength.

4. The fabricating method of claim 3, wherein another of the plurality of light-emitting units has power that deviates from a reference power range, and the phosphor layer is not deposited on the another of the light-emitting units.

5. The fabricating method of claim 1, wherein forming the plurality of light-emitting units includes:
   forming a first conductive layer of a first conductivity type, a light-emitting layer, and a second conductive layer of a second conductivity type, sequentially on the substrate; and
   patterning the second conductive layer, the light-emitting layer, and the first conductive layer to form the plurality of light-emitting units each having a first conductive pattern, a light-emitting pattern, and a second conductive pattern sequentially stacked.

6. The fabricating method of claim 5, prior to depositing the phosphor layer, further comprising:
   placing the substrate having the plurality of light-emitting units on a plate, the substrate having a first surface being on an opposite side of the light-emitting units than the plate,
   wherein the phosphor layer is deposited on a second surface of the substrate opposing the first surface.

7. The fabricating method of claim 6, further comprising:
   grinding the second surface of the substrate, after placing the substrate on the plate and prior to depositing the phosphor layer on the second surface of the substrate.

8. The fabricating method of claim 1, wherein the substrate is a package body substrate, and each of the plurality of light-emitting units is a light-emitting chip including a first chip electrode and a second chip electrode spaced apart from each other.

9. The fabricating method of claim 8, prior to depositing the phosphor layer, further comprising:
   forming a resin layer on the plurality of light-emitting units, wherein the phosphor layer is deposited on the resin layer.

10. The fabricating method of claim 8, prior to forming the plurality of light-emitting units on the substrate, further comprising:
   forming a plurality of through-holes passing through the substrate; and
   forming a plurality of first electrodes and a plurality of second electrodes,
   wherein each of the plurality of first and second electrodes is consecutively formed extending from the first surface to the second surface of the substrate,
   the light-emitting chips are placed on the substrate, and the first chip electrode and the second chip electrode are electrically connected to the first electrode and the second electrode, respectively.

* * * * *